United States Patent
Ohba et al.

(10) Patent No.: US 8,912,516 B2
(45) Date of Patent: Dec. 16, 2014

(54) MEMORY ELEMENT WITH ION SOURCE LAYER AND MEMORY DEVICE

(75) Inventors: Kazuhiro Ohba, Miyagi (JP); Tetsuya Mizuguchi, Kanagawa (JP); Shuichiro Yasuda, Kanagawa (JP); Masayuki Shimuta, Kanagawa (JP); Katsuhisa Aratani, Kanagawa (JP)

(73) Assignee: Sony Corporation, Tokyo (JP)

( * ) Notice: Subject to any disclaimer, the term of this patent is extended or adjusted under 35 U.S.C. 154(b) by 99 days.

(21) Appl. No.: 13/527,779

(22) Filed: Jun. 20, 2012

(65) Prior Publication Data

US 2013/0001497 A1    Jan. 3, 2013

(30) Foreign Application Priority Data

Jun. 30, 2011 (JP) ................. 2011-146114

(51) Int. Cl.
*H01L 29/02* (2006.01)
*H01L 27/24* (2006.01)
*H01L 45/00* (2006.01)
*G11C 13/00* (2006.01)

(52) U.S. Cl.
CPC .......... *H01L 45/085* (2013.01); *G11C 13/0007* (2013.01); *H01L 27/2436* (2013.01); *G11C 2213/79* (2013.01); *G11C 2213/56* (2013.01); *H01L 45/1266* (2013.01); *H01L 45/146* (2013.01); *G11C 2213/55* (2013.01); *G11C 2213/11* (2013.01); *H01L 45/1233* (2013.01); *G11C 2213/15* (2013.01); *H01L 27/2472* (2013.01)
USPC ...... 257/2; 257/4; 257/E45.002; 257/E21.52; 438/382

(58) Field of Classification Search
CPC ................. H01L 45/00; H01L 21/62
USPC .............. 257/2, 4, E45.002, E45.001, E21.52
See application file for complete search history.

(56) References Cited

U.S. PATENT DOCUMENTS 6,815,745 B2 * 11/2004 Higo et al. ................. 257/295
6,831,314 B2 * 12/2004 Higo et al. ................. 257/295
6,879,473 B2 *  4/2005 Sone et al. .............. 360/324.12

(Continued)

FOREIGN PATENT DOCUMENTS

JP     2006-196537       7/2006
JP     2009049322  A  *  3/2009

OTHER PUBLICATIONS

Rainer Waser et al.; Redox-Based Resistive Switching Memories—Nanoionic Mechanisms, Prospects, and Challenges; Advanced Materials; 2009, 21, 2632-2663.

*Primary Examiner* — Caleb Henry
(74) *Attorney, Agent, or Firm* — Dentons US LLP

(57) ABSTRACT

A memory element, including: a first electrode, a memory layer, and a second electrode in this order. The memory layer includes a resistance change layer containing an oxide, and the resistance change layer being provided on the first electrode side, and an ion source layer in a stacking structure of two or more of a unit ion source layer, the unit ion source layer including a first layer and a second layer, the first layer containing one or more of chalcogen elements of tellurium (Te), sulfur (S), and selenium (Se) and an easy-to-move element that is easy to move in the memory layer, and having a density distribution of the easy-to-move element from the first electrode to the second electrode, and the second layer containing a difficult-to-move element that is difficult to move in the memory layer.

14 Claims, 6 Drawing Sheets

BEFORE DIFFUSION
(A)

AFTER DIFFUSION
(B)

(56) References Cited

U.S. PATENT DOCUMENTS

| | | | |
|---|---|---|---|
| 6,879,514 B2* | 4/2005 | Hosomi et al. | 365/158 |
| 6,990,014 B2* | 1/2006 | Hosomi et al. | 365/158 |
| 6,992,868 B2* | 1/2006 | Sone et al. | 360/324.12 |
| 6,999,288 B2* | 2/2006 | Sone et al. | 360/324.12 |
| 7,026,671 B2* | 4/2006 | Mizuguchi et al. | 257/295 |
| 7,034,348 B2* | 4/2006 | Ohba et al. | 257/295 |
| 7,262,064 B2* | 8/2007 | Ohba et al. | 438/3 |
| 7,315,053 B2* | 1/2008 | Hosomi et al. | 257/295 |
| 7,696,511 B2* | 4/2010 | Ohba et al. | 257/4 |
| 8,134,139 B2* | 3/2012 | Lin et al. | 257/4 |
| 8,427,860 B2* | 4/2013 | Ohba et al. | 365/148 |
| 2003/0003365 A1* | 1/2003 | Sagawa et al. | 429/246 |
| 2003/0227799 A1* | 12/2003 | Higo et al. | 365/200 |
| 2004/0001372 A1* | 1/2004 | Higo et al. | 365/200 |
| 2004/0042129 A1* | 3/2004 | Mizuguchi et al. | 360/324.2 |
| 2004/0136232 A1* | 7/2004 | Hosomi et al. | 365/158 |
| 2004/0245553 A1* | 12/2004 | Hosomi et al. | 257/295 |
| 2004/0246788 A1* | 12/2004 | Sone et al. | 365/200 |
| 2004/0257719 A1* | 12/2004 | Ohba et al. | 360/324.2 |
| 2004/0262654 A1* | 12/2004 | Ohba et al. | 257/295 |
| 2005/0157542 A1* | 7/2005 | Hosomi et al. | 365/158 |
| 2005/0157545 A1* | 7/2005 | Hosomi et al. | 365/171 |
| 2005/0162904 A1* | 7/2005 | Sone et al. | 365/158 |
| 2005/0162905 A1* | 7/2005 | Sone et al. | 365/158 |
| 2006/0114618 A1* | 6/2006 | Hosomi et al. | 360/324.1 |
| 2006/0125034 A1* | 6/2006 | Ohba et al. | 257/421 |
| 2006/0187703 A1* | 8/2006 | Mizuguchi et al. | 365/158 |
| 2008/0006860 A1* | 1/2008 | Hosomi et al. | 257/295 |
| 2008/0121862 A1* | 5/2008 | Liu | 257/4 |
| 2009/0039337 A1* | 2/2009 | Ohba et al. | 257/4 |
| 2010/0265750 A1* | 10/2010 | Yan et al. | 365/51 |
| 2010/0291748 A1* | 11/2010 | Dressler et al. | 438/384 |
| 2011/0006277 A1* | 1/2011 | Kubo et al. | 257/2 |
| 2011/0140065 A1* | 6/2011 | Maesaka et al. | 257/2 |
| 2011/0180775 A1* | 7/2011 | Lin et al. | 257/4 |
| 2013/0240818 A1* | 9/2013 | Ohba et al. | 257/2 |

* cited by examiner

MEMORY ELEMENT WITH ION SOURCE LAYER AND MEMORY DEVICE

BACKGROUND

The present disclosure relates to a memory element storing information based on any change of electrical characteristics observed in a memory layer including an ion source layer and a resistance change layer, to a method of manufacturing the same, and to a memory device.

A semiconductor nonvolatile memory popularly used for data storage has been a NOR or NAND flash memory. As for such a semiconductor nonvolatile memory, many attempts have been made to increase the capacity thereof by the microfabrication of memory elements and drive transistors therein. However, the semiconductor nonvolatile memory has been pointed out that there are limitations on microfabrication considering the expectation for a high level of voltage for writing and erasing, and the limited number of electrons to be injected into a floating gate.

For overcoming such limitations on microfabrication, a next-generation nonvolatile memory currently proposed is a ReRAM (Resistance Random Access Memory) or a PRAM (Phase-Change Random Access Memory), for example (for example, see Waser et. al., Advanced Materials, 21, p2932 (2009), and Japanese Unexamined Patent Application Publication No. 2006-196537. These memories are each in the simple structure including a resistance change layer between two electrodes. In the memory of Japanese Unexamined Patent Application Publication No. 2006-196537, as an alternative to the resistance change layer, an ion source layer and an oxide film (thin film for storage) are provided between first and second electrodes. In these resistance change memories, a conductive path is formed through migration of atoms or ions by heat or an electric field, whereby a resistance value is supposed to change.

The resistance change memory described above is provided with an ion source layer, which contains elements of aluminum (Al), copper (Cu), zirconium (Zr), tellurium (Te), or others. For forming such an ion source layer containing the elements as above, an option is to form a mixture film of a homogeneous component by co-sputtering or using any alloy target, or to form a multi-layer film by forming films of individual elements. Forming a multi-layer film has an advantage of being able to form an ion source layer with the favorable operation performance even if a film-forming device in use is not capable of co-sputtering, for example.

SUMMARY

However, the resulting multi-layer film has a disadvantage of causing film detaching and peeling in the microfabrication process of a memory element.

It is thus desirable to provide a memory element with a reduced possibility of film detaching and peeling, a method of manufacturing the memory element, and a memory device.

According to an embodiment of the present technology, there is provided a memory element, including: a first electrode, a memory layer, and a second electrode in this order. The memory layer includes a resistance change layer containing an oxide, and the resistance change layer being provided on the first electrode side, and an ion source layer in a stacking structure of two or more of a unit ion source layer, the unit ion source layer including a first layer and a second layer, the first layer containing one or more of chalcogen elements of tellurium (Te), sulfur (S), and selenium (Se) and an easy-to-move element that is easy to move in the memory layer, and having a density distribution of the easy-to-move element from the first electrode to the second electrode, and the second layer containing a difficult-to-move element that is difficult to move in the memory layer.

According to an embodiment of the present technology, there is provided a memory device, including: a plurality of memory elements each including a first electrode, a memory layer, and a second electrode in this order; and a pulse application section applying a voltage or current pulse selectively to the memory elements. The memory layer includes a resistance change layer containing an oxide, and the resistance change layer being provided on the first electrode side, and an ion source layer in a stacking structure of two or more of a unit ion source layer, the unit ion source layer including a first layer and a second layer, the first layer containing one or more of chalcogen elements of tellurium (Te), sulfur (S), and selenium (Se) and an easy-to-move element that is easy to move in the memory layer, and having a density distribution of the easy-to-move element from the first electrode to the second electrode, and the second layer containing a difficult-to-move element that is difficult to move in the memory layer.

According to an embodiment of the present technology, there is provided a method of manufacturing a memory element. The method includes: forming a first electrode on a substrate; forming a resistance change layer containing an oxide on the first electrode; forming one or more chalcogen layers containing one or more of chalcogen elements of tellurium (Te), sulfur (S), and selenium (Se), one or more movable layers containing one or more of easy-to-move elements that are easy to move in an electrolyte, one or more fixed layers containing one or more of difficult-to-move elements that are difficult to move in the electrolyte, and an ion source layer including two or more unit ion source layers in which partially or more is in the stacking structure of the chalcogen layer, the movable layer, and the fixed layer in this order; and forming a second electrode on the ion source layer.

With the memory element (memory device) according to the embodiment of the present technology, when voltage or current pulses of "positive direction" (for example, the first electrode side is at a negative potential, and the second electrode side is at a positive potential) are applied with respect to the element in the initial state (the high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When voltage pulses of "negative direction" (for example, the first electrode side is at a positive potential, and the second electrode side is at a negative potential) are applied with respect to the element in the low-resistance state as such, the metallic element that has been deposited on the first electrode is ionized, and then is dissolved into the ion source layer. As a result, the conductive path containing the metallic element disappears, and the resistance change layer is increased in resistance (initial state or state of erasing).

Herein, the ion source layer contains one or more of chalcogen elements of tellurium (Te), sulfur (S), and selenium (Se). The ion source layer is in the stacking structure including two or more unit ion source layers, each of which is a combination of a first layer containing an easy-to-move element that is easy to move in the memory layer, and a second layer containing a difficult-to-move element that is difficult to move in the memory layer. In the first layer, the easy-to-move element has a density distribution from the first electrode to the second electrode. Such a structure improves the layer-to-layer adhesion.

According to the memory element, the method of manufacturing the same, and the memory device according to the embodiments of the present technology, the ion source layer contains one or more of chalcogen elements of tellurium (Te), sulfur (S), and selenium (Se), and is in the stacking structure including two or more unit ion source layers, each of which is a combination of a first layer containing an easy-to-move element that is easy to move in the memory layer, and a second layer containing a difficult-to-move element that is difficult to move in the memory layer. Moreover, in the first layer, the easy-to-move element varies in density from the first electrode to the second electrode. With such a structure, the layer-to-layer adhesion is improved in the memory element, and the possibility of film detaching and peeling is reduced. To be specific, the resulting memory device is with the improved yield and high reliability.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENTS

In the below, embodiments of the present disclosure are described in the following order by referring to the accompanying drawings.
[First Embodiment]
 1. Memory Element (Memory element in which a memory layer includes a resistance change layer and an ion source layer)
 2. Method of Manufacturing Memory Element
 3. Memory Device

[Second Embodiment]
(Memory element in which a memory layer includes a resistance change layer, an intermediate layer, and an ion source layer)

EXAMPLES

[First Embodiment]
[Memory Element]

Figure 1:
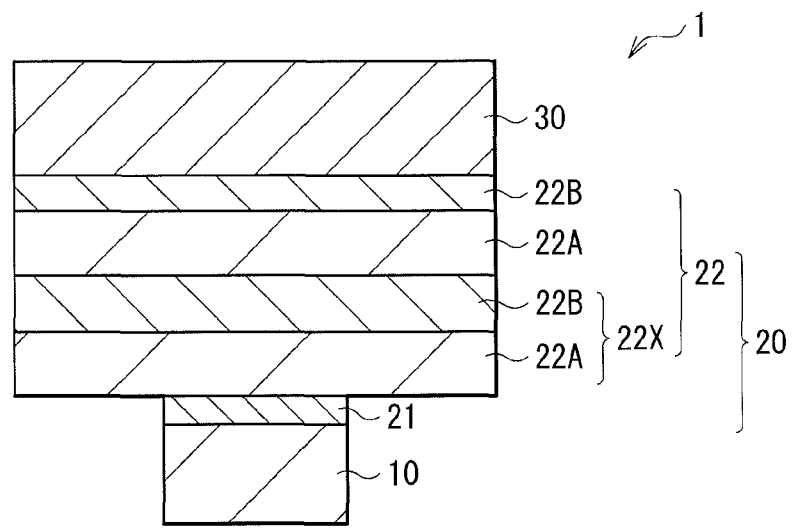
FIG. 1 is a cross-sectional diagram showing one configuration of a memory element according to a first embodiment of the present disclosure.
Figure 2:
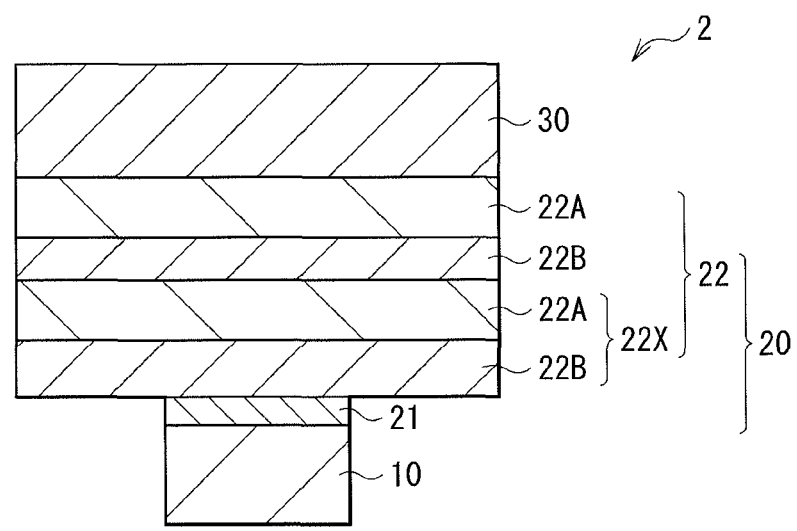
FIG. 2 is a cross-sectional diagram showing another configuration of the memory element according to the first embodiment of the present disclosure.

FIGS. 1 and 2 are each a cross-sectional view of a memory element 1 according to a first embodiment of the present disclosure, showing the configuration thereof. This memory element 1 includes a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 4), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material (for example, Cu) that possibly causes ion conduction in an electric field, the surface of the lower electrode 10 may be covered with a material that hardly causes ion conduction or thermal diffusion, e.g., W, WN, titanium nitride (TiN), and tantalum nitride (TaN). When an ion source layer 22 that will be described later contains Al, preferably used is a metal film containing one or more of chromium (Cr), W, cobalt (Co), Si, gold (Au), palladium (Pd), Mo, iridium (Ir), titanium (Ti), and others that are more resistant to ionization than Al, or an oxide or nitride film thereof.

The memory layer 20 is configured by a resistance change layer 21, and the ion source layer 22. The resistance change layer 21 is provided on the lower electrode 10 side, and in this example, is in contact with the lower electrode 10. This resistance change layer 21 serves as a barrier against electric conduction. The resistance change layer 21 shows a change of resistance value when a predetermined level of voltage is applied between the lower and upper electrodes 10 and 30. The resistance change layer 21 may be made of any type of substance as long as it is an insulator or a semiconductor that remains stable even if it is in contact with the ion source layer 22 that will be described later. Such a material is specifically exemplified by an oxide or nitride including one or more of rare-earth elements such as Gd (gadolinium), and Al, Mg (magnesium), Si (silicon), and others.

The resistance change layer 21 preferably has the initial resistance value of 1 M$\Omega$ or larger, and the resistance value in the state of low resistance is preferably several hundreds of k$\Omega$ or smaller. For reading at a high speed the state of resistance of any microfabricated resistance change memory, the resistance value in the state of low resistance is preferably as low as possible. However, since the resistance value is 40 to 100 k$\Omega$ when writing is performed under the condition of 20 to 50 $\mu$A and 2 V, for example, the memory is supposed to have the initial resistance value higher than that value. Allowing for the one-digit width of resistance separation, the resistance value described above is considered appropriate.

The ion source layer 22 contains an element to be converted into movable ions (cations and anions) that diffuse to the resistance change layer 21. In this embodiment, the ion source layer 22 is in the stacking structure of including two or more unit ion source layers 22X. The unit ion source layer 22X includes first and second layers 22A and 22B, which are disposed one on the other. The first layer 22A contains an element that easily diffuses to the resistance change layer 21, in other words, an element that is easily converted into movable ions. On the other hand, the second layer 22B contains an element that does not easily diffuse to the fist layer 22A and the resistance change layer 21, in other words, an element that is not easily converted into ions in the ion source layer 22.

The first layer 22A contains, as an anionic component(s), one or more of chalcogen elements including tellurium (Te), sulfur (S), and selenium (Se), for example. As a cationic component(s), the first layer 22A contains one or more of elements (easy-to-move elements) that are easy to move in an electrolyte (the ion source layer 22 in this example). Such easy-to-move elements are those easily mixed with the chalcogen elements, and are specifically exemplified by Al or copper (Cu). In addition to the elements described above, the first layer 22A may contain germanium (Ge), zinc (Zn), silver (Ag), and others. The chalcogen element(s) and the easy-to-move element(s) are bonded together in the first layer 22A, thereby forming a metal chalcogenide layer. This metal chalcogenide layer is mainly in the amorphous structure, and serves as an ion supply source. The first layer 22A has therein the density distribution of the easy-to-move element(s), and this will be described in detail later.

The second layer 22B contains one or more of elements (difficult-to-move elements) that are difficult to move in the electrolyte (the ion source layer 22). Such difficult-to-move elements are those configuring the resistance change layer 21 and the ion source layer 22, especially those hardly reacting with a chalcogen element of Te, for example. The difficult-to-move elements are exemplified by elements of Groups 4 to 6 in the long-periodic table. These elements are specifically Ti, zirconium (Zr), hafnium (Hf), vanadium (V), niobium (Nb), Ta, Cr, Mo, and W. In addition, elements reacting with chalcogen elements of Cu, Ag, Ze, and others may be used as additive elements, and Si, Ge, and others may be used without departing from the scope of the present disclosure.

As described above, the first and second layers 22A and 22B are disposed one on the other in pairs as the unit ion source layer 22X. Two or more unit ion source layers 22X are stacked in layers to configure the ion source layer 22. In the ion source layer 22, the first and second layers 22A and 22B are alternately stacked such that the ion source layer 22 is in the repeated stacking structure. In this repeated stacking structure, the order of layer stacking is not particularly restrictive, and as shown in FIG. 1, layer stacking may be started with the first layer 22A from the resistance change layer 21 side, or with the second layer 22B as shown in FIG. 2. The stacking structure is not particularly restrictive as long as two or more pairs of the first and second layers 22A and 22B are repeatedly stacked. However, with repeated stacking of five or more pairs, adhesion between layers is improved to a further extent so that the possibility of film peeling is reduced.

As described above, the first layer 22A has therein the density distribution of the easy-to-move element(s). To be specific, the density of the easy-to-move element(s) is relatively low on the interface with the attaching second layer 22B than that in the remaining region. In other words, compared with the middle portion of the first layer 22A in the thickness direction, the density of the easy-to-move element(s) is low or zero on the interface portion of the upper or lower surface being in contact with the second layer 22B. The easy-to-move element in the form of metal not reacting with the chalcogen element(s) in the first layer 22A is poor in adhesion with the difficult-to-move element(s) in the form of metal contained in the second layer 22B. Therefore, if the easy-to-move element in the form of metal is high in density on the interface between the first and second layers 22A and 22B, this easily causes film detaching and peeling. This means that, by reducing the density of the easy-to-move element on the interface of the first layer 22A in contact with the second layer 22B containing the difficult-to-move element in the form of metal as in the embodiment, the possibility of film detaching and peeling between the layers is reduced. Herein, how to adjust the density distribution of the easy-to-move element(s) observed in the first layer 22A will be described later in the manufacturing process of the ion source layer 22 below.

Similarly to the interface with the second layer 22B, also on the surface where the ion source layer 22 is in contact with the upper electrode 30, the density of the easy-to-move element(s) in the first layer 22A is preferably low or zero in the form of metal. This is because, compared with a chalcogen element, the easy-to-move element such as Al in the first layer 22A does not easily react with the element configuring the upper electrode 30. When the easy-to-move element(s) in the first layer 22A are high in density on the surface in contact with the upper electrode 30, the resulting interface becomes unstable with the chalcogen element and the easy-to-move element(s). This results in film detaching and peeling of the upper electrode 30. In consideration thereof, when the first layer 22A is in contact with the upper electrode 30, similarly to the structure in which the first layer 22A is in contact with the second layer 22B, adjusting the density of the easy-to-move element(s) in the first layer 22A increases the adhesion between the ion source layer 22 and the upper electrode 30, thereby reducing the possibility of film detaching and peeling between the layers.

Similarly to the lower electrode 10, the upper electrode 30 may be made of a well-known material for use of semiconductor wiring, and preferably, be made of a stable material not reacting with the ion source layer 22 even after a post-annealing process.

With such a memory element 1 of the embodiment, when a voltage or current pulse is applied by a power supply circuit (pulse application section; not shown) via the lower and upper electrodes 10 and 30, the memory layer 20 shows a change of the electrical characteristics (the resistance value) thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element (the easy-to-move element and the transition metallic element) in the ion source layer 22 is ionized and diffused to the resistance change layer 21, and then is deposited by bonding with electrons on the lower electrode 10 side. As a result, a conductive path (filament) is formed on the interface between the lower electrode 10 and the memory layer 20. This filament is made of a low-resistance metallic element reduced in the form of metal. Alternatively, the ionized metallic element remains in the resistance change layer 21, and forms an impurity level. As a result, a filament is formed in the resistance change layer 21, and this accordingly decreases the resistance value of the memory layer 20 such that the resistance value is changed to be lower (to be in the low-resistance state) than that in the initial state (in the high-resistance state).

Thereafter, even if the memory element 1 becomes free of voltage by stopping the application of the positive voltage thereto, the state of low resistance remains as it is. This means information writing is done. For use in a once-writable memory device, i.e., a so-called PROM (Programmable Read Only Memory), the memory element 1 is completed with recording only by the process of recording described above.

On the other hand, for application use in an erasable memory device, i.e., RAM (Random Access Memory), EEPROM (Electronically Erasable and Programmable Read Only Memory), or others, a process of erasing is expected. During the process of erasing, a negative voltage is applied to the memory element 1 such that the upper electrode 30 is at a negative potential, and the lower electrode 10 side is at a positive potential, for example. In response thereto, the anodic reaction (oxidation) occurs on the lower electrode 10. To be specific, in the filament formed inside of the adjacent memory layer 20, the metallic element is ionized, and then is dissolved into the ion source layer 22, or the easy-to-oxidize easy-to-move element (for example, Al) is oxidized, thereby forming a high-resistance oxide (for example, AlOx) on the lower electrode 10. In other words, the memory layer 20 is increased in resistance value.

Thereafter, even if the memory element 1 becomes free of voltage by stopping the application of the negative voltage thereto, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

Described next is the chemical action and preferred content of the elements in the ion source layer 22. Note that the content of each of the elements that will be described later is the total content in the repeated stacking structure including the first and second layers 22A and 22B.

The entire composition of the ion source layer 22 is exemplified by ZrTeAl, TiTeAl, CrTeAl, WTeAl, TaTeAl, and others. Such specific materials may also include CuZrTeAl being a result of addition of Cu to ZrTeAl, and CuZrTeAlGe being a result of another addition of Ge to CuZrTeAl. With an addition of the above-described additive element, CuZrTeAl-SiGe is also an option.

The ion source layer 22 contains the easy-to-move element (for example, Al or Cu) to be cationized, and the difficult-to-move element (for example, Zr or Ti) as described above. These elements to be cationized form filaments containing both the easy-to-move and difficult-to-move elements by the low-resistance operation described above. In these filaments, the filament containing the difficult-to-move element such as Zr specifically contributes to the improvement of the characteristics of data retention in the state of writing. To be specific, Cu forms a filament by the operation of writing, for example. However, Cu in the form of metal is dissolved easily in the ion source layer 22 containing the chalcogen element(s), and in the state of no application of a voltage pulse for writing (in the state of data retention), Cu is thus ionized again. In other words, the memory layer 20 is changed in state to high resistance. The resulting characteristics of data retention are not thus satisfactory. On the other hand, Zr forms a metal filament by being reduced on the cathode electrode during the operation of writing, and is put in the state of writing (low-resistance state). The filament containing Zr is relatively difficult to dissolve in the ion source layer 22 containing the chalcogenide element(s). Therefore, once the state is put in writing, that is, in the low-resistance state, the resulting low-resistance state is retained more easily than in the case with a filament containing Al or Cu, for example. As such, combining an easy-to-move element such as Cu with a difficult-to-move element with any appropriate content of Zr or others in the ion source layer 22 facilitates amorphization in the ion source layer 22, and keeps uniform the microstructure of the ion source layer 22. This means the improvement of the characteristics of resistance value retention (the characteristics of data retention).

Figure 6:
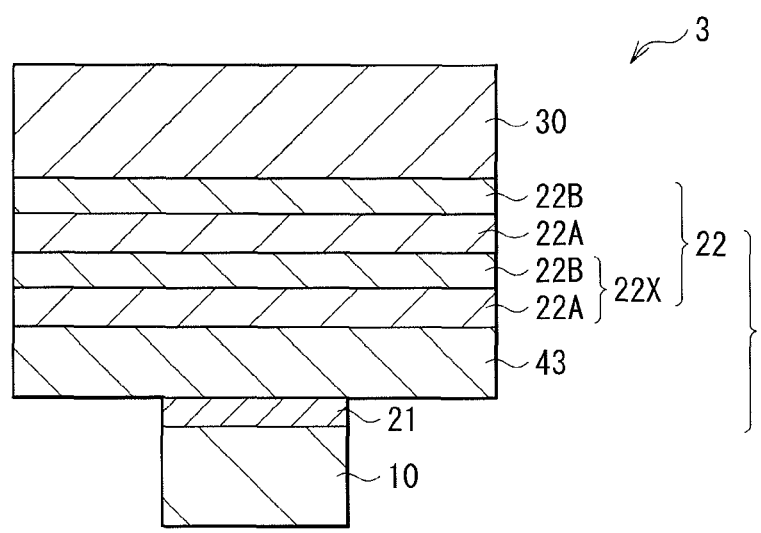
FIG. 6 is a cross-sectional diagram showing one configuration of a memory element according to a second embodiment of the present disclosure.

When the ion source layer 22 contains Al, if the upper electrode is biased to a negative potential as a result of the erasing operation, formed is an oxide film (AlOx) stable on the interface between the ion source layer 22 behaving like a solid-electrolyte layer and the anode electrode as described above. This makes stable the high-resistance state (the erasing state). This also contributes to the increase of the repetition frequency considering the self-reproduction of the resistance change layer. When an intermediate layer 43 (refer to FIG. 6) with a high content of the chalcogen element (will be described later) is additionally provided between the resistance change layer 21 and the ion source layer 22, this structure allows voltage bias application with a better efficiency on the interface between the anode electrode and the lower electrode 10 during the erasing operation described above. This accordingly increases the efficiency of the anodic reaction, makes the filaments easy to dissolve, and easily forms a high-resistance oxide film of the easy-to-move element such as Al. Herein, Al is surely not the only option, and Ge or others acting similarly may be also used.

As described above, when the ion source layer 22 contains Zr, Cu, Al, Ge, and others, compared with the memory element not containing such elements, the resulting memory element has the improved characteristics of wide-range resistance value retention, those of high-speed operation of writing and erasing, and those of low-current operation, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms deposited by changing a write current during a change of resistance from high to low.

Such various characteristics important for the operation of memory as the characteristics of operation of writing and erasing with voltage application, the characteristics of resistance value retention, and the repetition frequency of operation, vary depending on the addition content of Al, Zr, and Cu, and also Ge in the ion source layer 22.

As described above, when the content of Al is too much, for example, the Al ions exist more in the vicinity of the resistance change layer. As a result, reduction of the Al ions contributes greatly in the filament in the state of writing. After the reduction, Al is almost in the form of metal, and thus is not stable enough in the form of metal in the chalcogenide solid electrolyte. Therefore, the characteristics of low-resistance writing state retention are impaired. On the other hand, when the content of Al is too little, the effect of improving the erasing operation itself or the characteristics of high-resistance region retention are impaired due to a difficulty in forming the high-resistance film (AlOx) during the erasing operation, thereby decreasing the repetition frequency. In consideration thereof, the content of Al in the ion source layer 22 is preferably 27.7 atomic % or more, and more preferably, 47.4 atomic % or less.

If the content of Zr is too much, for example, the resulting ion source layer 22 is decreased too much in resistance value, thereby failing in voltage application effectively to the ion source layer 22, or resulting in too much stability in the state of writing due to a high degree of contribution of Zr in the filament in the state of writing. This especially causes a difficulty in erasing, and the threshold voltage for erasing is increased based on the addition content of Zr. If the content of Zr is all too much, this results in a difficulty also in writing, that is, in decreasing of resistance. On the other hand, if the addition content of Zr is too little, the effect of improving the characteristics of wide-range resistance value retention as described above is impaired.

Although adding an appropriate content of Cu to the ion source layer 22 indeed facilitates amorphization, if the content thereof is too much, Cu in the form of metal degrades the characteristics of writing retention or adversely affects the speed of the writing operation as is not stable enough in the ion source layer 22 containing the chalcogen element(s). Whereas a combination of Zr and Cu produces the effect of making amorphous the ion source layer 22 with ease, and of keeping uniform the microstructure of the ion source layer 22. This accordingly prevents the material components in the ion source layer 22 from becoming non-uniform by the repeated operation, thereby increasing the repetition frequency and improving the retention characteristics. When the content of Zr in the ion source layer is appropriate, the filament of metal zirconium (Zr) is supposed to remain as it is in the resistance change layer 21 even if the filament made of Cu is dissolved again into the ion source layer 22, and thus the state of low resistance remains as it is. As such, the characteristics of writing retention are not affected.

For the effect produced in combination of Zr and Cu as above, the total content of Zr and Cu in the ion source layer 22 is preferably in the range from 23.5 atomic % to 37 atomic % both inclusive. The content of only Zr in the ion source layer 22 is preferably 9 atomic % or more, and more preferably, is 18.5 atomic % or less.

Herein, Ge is not necessarily contained, but when Ge is to be added, the content thereof is preferably 15 atomic % or less considering that too much content of Ge degrades the characteristics of writing retention.

Note here that, virtually, the characteristics of the memory element 1 are dependent on the composition ratio between Zr and Te (chalcogen element). Accordingly, the composition ratio between Zr and Te preferably falls within the following range.

Composition Ratio of Zr (Atomic %)/Composition Ratio of Te (Atomic %)=0.3 to 0.84

This is not necessarily evident, but because Cu has the degree of dissociation lower than that of Zr, and because the resistance value of the ion source layer 22 is determined by the composition ratio between Zr and Te, as long as the composition ratio between Zr and Te falls within the above-described range, the resistance value remains suitable. This thus seems because the bias voltage applied to the memory element 1 works effectively to the portion of the resistance change layer 21. The content of only the chalcogen element is preferably 20.7 atomic % or more but is 42.7 atomic % or less.

When the value does not fall within the range described above, for example, when the equivalence ratio is too large, the balance between the cations and anions is lost, and thus among the existing metallic elements, any element not ionizing is increased in amount. Therefore, the filament generated by the operation of writing during the operation of erasing may not be eliminated efficiently. Similarly, when the anion element exists too much because the equivalence ratio is too small, the filament in the form of metal generated by the operation of writing is not inclined to remain in the form of metal. The characteristics of writing state retention thus seem to be impaired.

Herein, the metallic element contained in the ion source layer 22 is surely not restrictive to those described above, and another option may be ZrTeMg including Mg as an alternative to Al. As for the ionizing metallic element, any similar additive element is possibly used even if a transition metallic element selected for use is not Zr but Ti or Ta, e.g., possibly TaTeAlGe. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others. Note that Al is not necessarily contained, and CuGeTeZr or others may be also used.

Moreover, Si is an exemplary additive element that possibly offers the improvement of the retention characteristics, and is preferably added to the ion source layer 22 together with Zr. Herein, if the content of Si for addition is not enough, the effect of preventing the film peeling by the addition of Si is not sufficiently produced, and if the content thereof is too much, the resulting memory operation characteristics are not satisfactory enough. In consideration thereof, the content of Si in the ion source layer 22 is preferably in the range of about 10 to 45 atomic % to produce the effect of preventing the film peeling, and to have the satisfactory memory operation characteristics.

Moreover, when the intermediate layer 43 with a high content of a chalcogen element is formed between the resistance change layer 21 and the ion source layer 22, by using the above-described easy-to-move metallic element M (for example, Al or Cu) together with a chalcogen element (for example, Te), the resulting ion source layer 22 may be in the multi-layer structure of Te/Ion Source Layer (containing the easy-to-move metallic element). If this is the structure, by diffusion after the film formation, the resulting structure is stabilized as MTe/Ion Source Layer 22. This prevents the easy-to-move element in the form of metal from being dense on the interface between the intermediate layer 43 and the lower electrode 10, thereby preventing the resistance change layer 21 and the ion source layer 22 from film peeling and detaching.

In the below, the method of manufacturing the memory element 1 in the embodiment is described.

First of all, on a substrate formed with a CMOS circuit such as selection transistor, the lower electrode 10 made of TiN is formed, for example. Thereafter, if appropriate, any oxides or others on the surface of the lower electrode 10 are removed by reverse sputtering, for example. Next, an Al film is formed on the lower electrode 10 in a device for sputtering, for example, and oxidation of Al is performed in the atmosphere of oxygen by RF (Radio Frequency) plasma, thereby forming the resistance change layer 21.

Next, layers of a chalcogen layer 22a, a movable layer 22b, and a fixed layer 22c are formed on the resistance change layer 21. The chalcogen layer 22a contains one or more of chalcogen elements of Te, S, and Se. The movable layer 22b contains one or more of the easy-to-move elements described above, and the fixed layer 22c contains one or more of the difficult-to-move elements described above. To be specific, the layers are formed in succession through exchange of targets each with the composition in a device for sputtering.

These layers, i.e., the chalcogen layer 22a (layer A), the movable layer 22b (layer B), and the fixed layer 22c (layer C), are so stacked that the movable layer 22b with a high content of the easy-to-move element(s) is not in direct contact with the fixed layer 22c with a high content of the difficult-to-move element(s). To be specific, the layer B or C may be sandwiched between the layers A like ABAC, BACA, or CABA, for example. The resulting structure is counted as a unit, and stacking of two or more units, preferably stacking of five units or more is preferable. As a result, the ion source layer 22 has the repeated stacking structure. Herein, there is no specific upper limit to the number of units for stacking, but too many units for stacking increases the film thickness of the ion source layer 22, thereby easily causing film peeling. Too many units for stacking also increase the drive voltage for writing and erasing. Moreover, the number of times of the target exchange during film formation is increased, and the time for the film formation thus takes longer, thereby causing a difficulty in manufacturing. In consideration thereof, the upper limit to the number of units for stacking is preferably 50 or less. As described above, by stacking the layers of individual elements, the resulting ion source layer 22 is provided with the satisfactory operation characteristics even if a film-forming device in use is not capable of co-sputtering, for example. Moreover, since the use of alloy target is not expected, the restrictions on film-formation facilities are relaxed, thereby consequently leading to the cost reduction.

When the unit is ACAB together with the order of layer stacking described above, for example, the layer B with a high content of easy-to-move element(s) comes at the top end of the ion source layer 22. In such a case, since the easy-to-move element(s) are dense on the surface attaching with the upper electrode 30 as described above, the resulting interface is with the chalcogen element of the layer A and the easy-to-move element(s) in the form of metal, thereby possibly causing film detaching and peeling. If this is the case, after stacking of a plurality of the ACAB units, the layer A is preferably provided additionally at the top end of the stacking structure. This prevents the direct contact between the upper electrode 30 and the layer B, to be specific, this prevents the easy-to-move element(s) from being dense on the interface between the ion source layer 22 and the upper electrode 30. This thus improves the adhesion between the ion source layer 22 and the upper electrode 30, thereby reducing the possibility of film detaching and peeling.

Thereafter, the upper electrode 30 is formed on the ion source layer 22 by sputtering. After the formation of layers up to the upper electrode 30, a wiring layer (not shown) is formed for connection to the upper electrode 30, and a contact section is connected to achieve a common potential among all of the memory elements 1. Thereafter, the multi-layer film is subjected to a post-annealing process.

Figure 3:
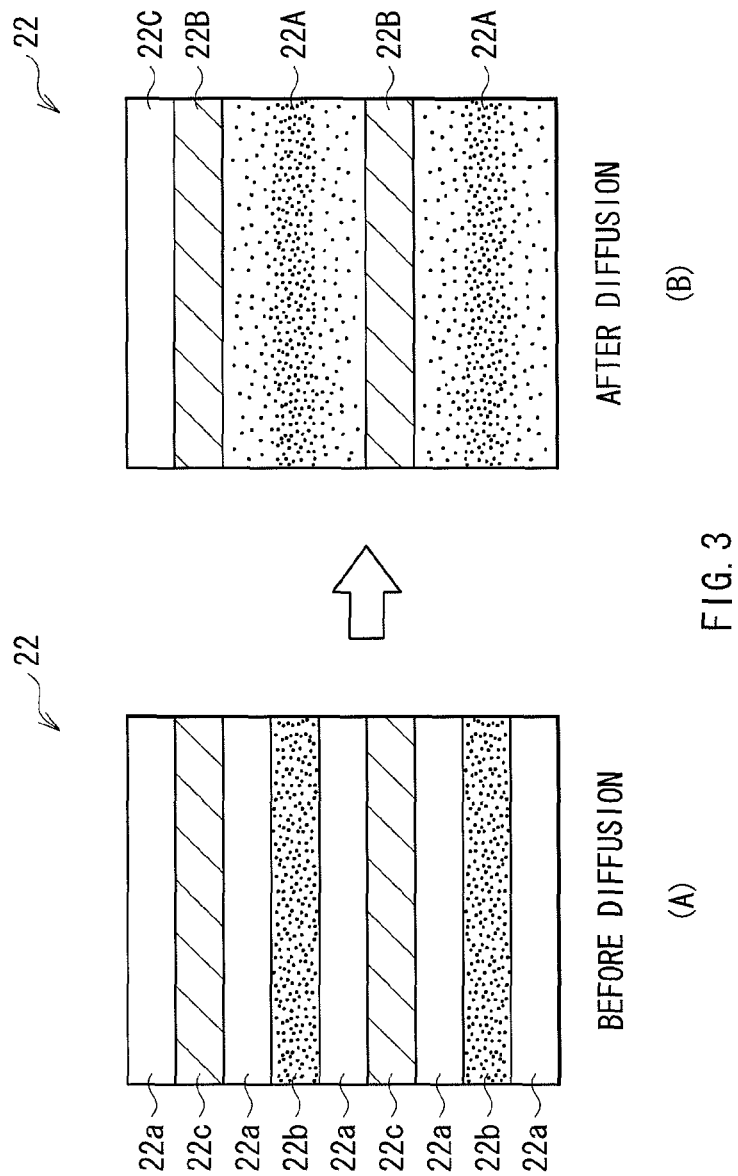
FIG. 3 is a schematic diagram illustrating the density distribution observed in an ion source layer of the memory element of FIG. 1.

By this post-annealing process or by thermal diffusion at room temperature, in the ion source layer 22 including the chalcogen layer 22a (layer A), the movable layer 22b (layer B), and the fixed layer 22c (layer C), the easy-to-move element(s) configuring the layer B diffuse into the layer A. This forms the density distribution of the easy-to-move element(s) in the first layer 22A. This structure prevents the easy-to-move element(s) in the movable layer 22b from being dense on the surfaces of the first layers 22A where the fixed layer 22c, i.e., the second layer 22B, is in contact as is sandwiched therebetween so that the layer-to-layer adhesion is improved. FIG. 3 schematically shows the layers before and after thermal diffusion in the ion source layer 22 in which two multi-layer films each being a unit of ABAC are stacked. By the post-annealing process, the easy-to-move element(s) configuring the layer B diffuse into the layer A, thereby forming the first layer 22A. The easy-to-move element(s) configuring the layer C hardly diffuse, thereby forming an independent layer in the ion source layer 20, that is, the second layer 22B. In this manner, the memory element 1 of FIG. 1 is completed.

Note that the density distribution of the easy-to-move element in the first layer 22A looks different depending on which layer (the layer A or C) is deposited above and below the layer B. As shown in (A) of FIG. 3, for example, when the layer B is sandwiched between the layers A, the easy-to-move element(s) diffuse into the layers A on both sides of the lower electrode 10 and the upper electrode 30, and as shown in (B) of FIG. 3, the density shows a gradual decrease in the vertical direction from the middle portion of the first layer 22A.

With the memory element 1, as described above, a voltage is so applied that the upper electrode 30 is at a positive potential and the lower electrode 10 is at a negative potential. This forms a filament on the interface between the lower electrode 10 and the resistance change layer 21. This accordingly decreases the resistance value of the resistance change layer 21 so that writing is performed. Next, to each of the upper and lower electrodes 30 and 10, applied this time is a voltage whose polarity is opposite to that applied thereto for writing. In response thereto, the metallic element in the filament formed inside of the resistance change layer 21 is ionized again, and then is dissolved into the ion source layer 22. This accordingly increases the resistance value of the resistance change layer 21 so that erasing is performed.

With the method of manufacturing the memory element 1 according to the embodiment, for use as the ion source layer 22, three layers are formed, including the chalcogen layer 22a containing a chalcogen element, the movable layer 22b containing an easy-to-move element, and the fixed layer 22c containing a difficult-to-move element. As such, in the memory element 1 of this embodiment, the ion source layer 22 has the repeated stacking structure including two or more pairs of the first and second layers 22A and 22B, which are disposed one on the other. The first layer 22A contains a chalcogen element and an easy-to-move element, and shows the density gradient of the easy-to-move element from the lower electrode 10 toward the upper electrode 30. The second layer 22B contains a difficult-to-move element. Such a repeated stacking structure improves adhesion between layers in the memory element 1, especially in the memory layer 20. Note that, in view of having the satisfactory writing and erasing operation characteristics, stacking of five or more pairs of the first and second layers 22A and 22B is preferable.

As described above, in the memory element 1 (and the method of manufacturing the same and the memory device) of this embodiment, the ion source layer 22 is configured by two or more of each of the three layers, i.e., the chalcogen layer 22a containing a chalcogen element, the movable layer 22b containing an easy-to-move element, and the fixed layer 22c containing a difficult-to-move element. The resulting ion source layer 22 includes two or more unit ion source layers 22X, which are repeatedly stacked one on the other. The unit ion layer 22X includes the first and second layers 22A and 22B that are different in composition. The first layer 22A contains a chalcogen element and an easy-to-move element, and has a density distribution in which the density of the easy-to-move element is high in the middle portion thereof than the upper and lower ends thereof in the thickness direction. This accordingly improves the adhesion between layers in the memory element, thereby reducing the possibility of film detaching and peeling. In other words, the resulting memory device is with the improved yield and high reliability.

Further, by stacking the layers of individual elements, the resulting ion source layer 22 is provided easily with the satisfactory operation characteristics. Still further, since the use of alloy target is not expected, the restrictions on film-formation facilities are relaxed, thereby consequently leading to the cost reduction.

(Memory Device)

By arranging a large number of memory elements 1 described above in rows or in a matrix, for example, a memory device (memory) is possibly configured. At this time, as appropriate, the memory elements 1 may be each connected with a MOS (Metal Oxide Semiconductor) transistor for element selection use or with a diode to configure a memory cell. The resulting memory cells may be then each connected to a sense amplifier, an address decoder, circuits of writing, erasing, and reading, and others by wiring.

Figure 4:
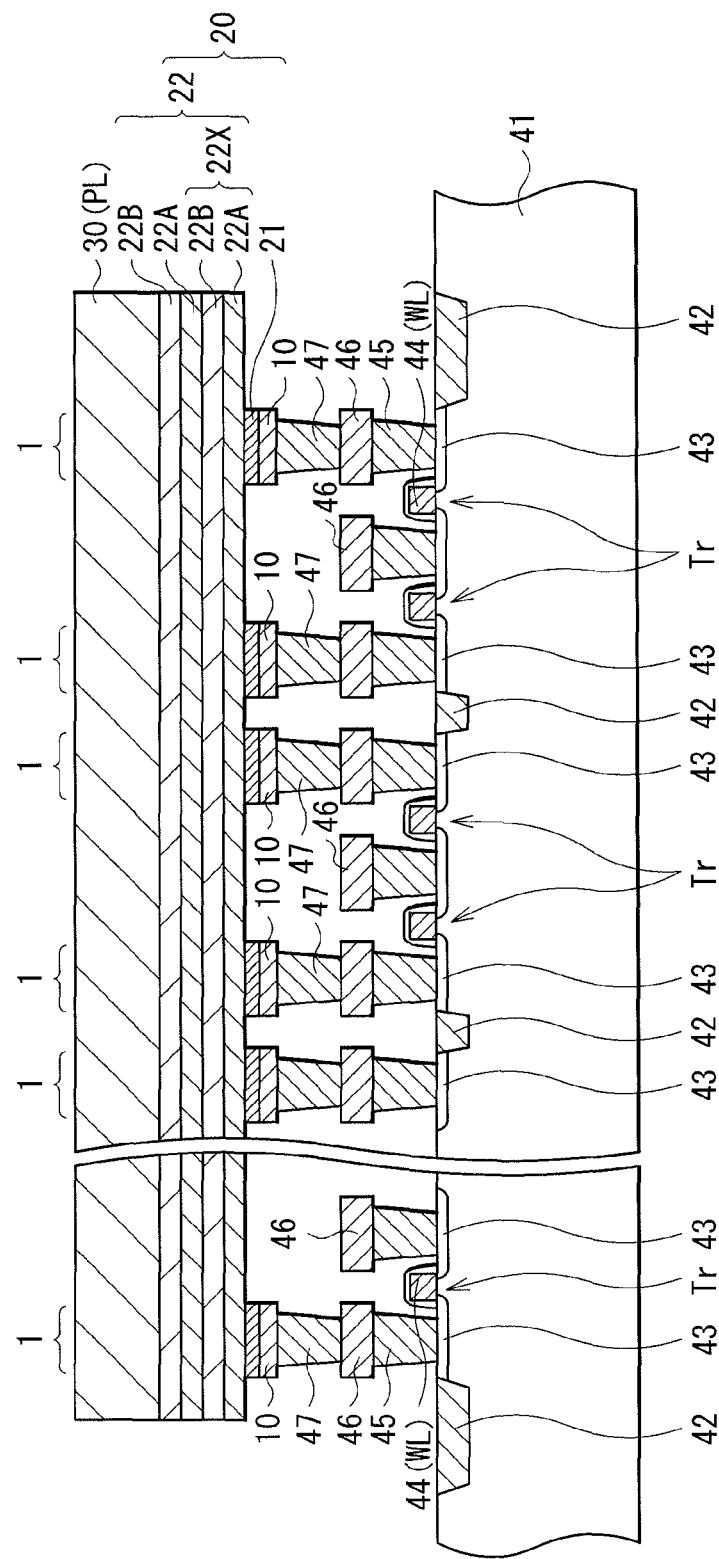
FIG. 4 is a cross-sectional diagram showing the configuration of a memory cell array using the memory element of FIG. 1.
Figure 5:
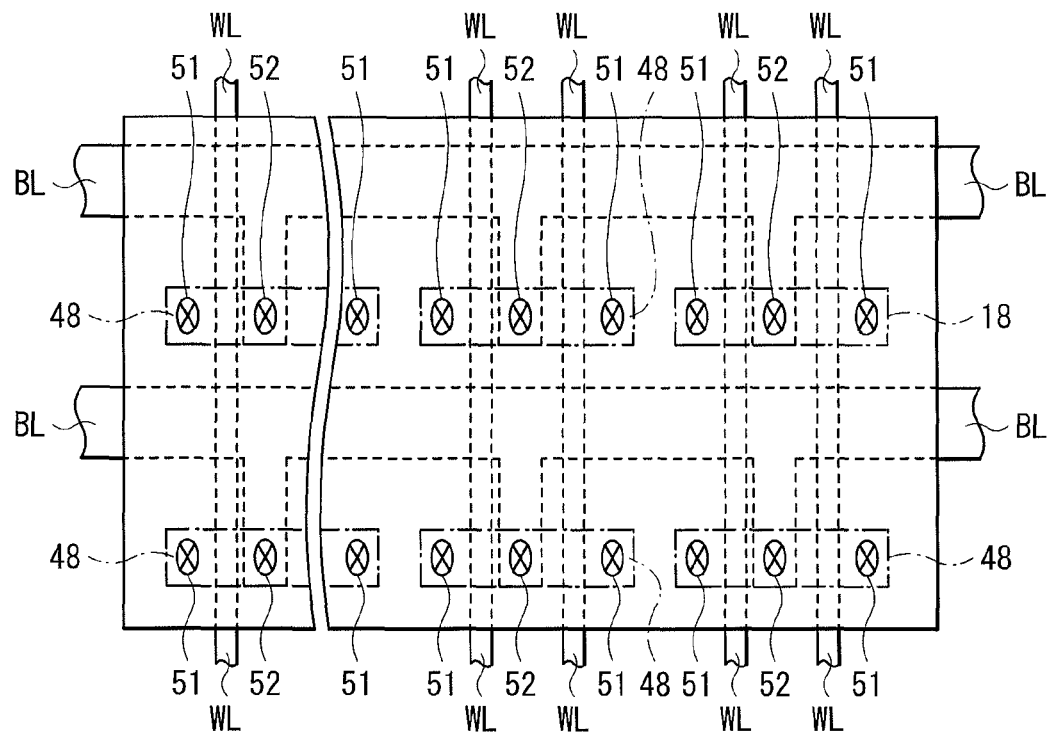
FIG. 5 is a plan view of the memory cell array of FIG. 4.

FIGS. 4 and 5 each show an exemplary memory device (memory cell array) including a large number of memory elements 1 arranged in a matrix. FIG. 4 shows the cross-sectional configuration of the memory cell array, and FIG. 5 shows the configuration thereof in a planar view. In this memory cell array, to each of the memory elements 1, wiring connected to the lower electrode 10 side thereof is so provided as to intersect wiring connected to the upper electrode 30 side thereof, and at the respective intersection points, the memory element 1 is disposed, for example.

The memory elements 1 share the layers, i.e., the resistance change layer 21, the ion source layer 22, and the upper electrode 30. In other words, these layers, i.e., the resistance change layer 21, the ion source layer 22, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position to correspond to its lower electrode 10. The lower electrode 10 is connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A sidewall insulation layer is formed on the wall surface of the gate electrode 44. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 5), which is the remaining piece of address wiring for the memory element 1. Note that, in FIG. 5, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain regions 43 of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance, whereby the selected memory cell is written with information. Next, when the potential of the voltage applied this time to the lower electrode 10 is positive compared with the potential of the upper electrode 30 (the plate electrode PL), the memory element 1 is changed in resistance state again to high, whereby the information written to the selected memory cell is erased. For reading of the written information, for example, a selection of memory cell is made by the MOS transistor Tr, and with respect to the selected memory cell, a predetermined level of voltage or current is applied. The current or voltage for application to the memory element 1 varies in level based on the resistance state of the memory element 1 at this time, and such varying values are detected via a sense amplifier or others connected to the tip of the bit line BL or of the plate electrode PL. Herein, the voltage or current applied to the selected memory cell is set to be smaller than the threshold value of the voltage or others at which the memory element 1 shows a change of resistance state.

The memory device 1 of the first embodiment is applicable to various types of memory devices as described above. For example, the memory device applicable for use includes any types of memories such as once-writable PROM (Programmable Read Only Memory), electrically erasable EEPROM, or so-called RAM available for writing, erasing, and reproduction at a high speed.

[Second Embodiment]

FIG. 5 is a cross-sectional diagram showing the configuration of a memory element 2 according to a second embodiment of the present disclosure. Any configuration component similar to that of the first embodiment described above is provided with the same reference numeral, and is not described again. The memory element 2 includes the lower electrode 10 (first electrode), a memory layer 40, and the upper electrode 30 (second electrode) in this order. The memory element 2 in this embodiment is different from the memory element in the first embodiment in the respect that the intermediate layer 43 is provided between the resistance change layer 21 and the ion source layer 22, which configure the memory layer 40.

The intermediate layer 43 has a lower resistivity than the resistance change layer 21, and contains a compound with a high content of chalcogen element(s), i.e., one or more of Te, S, and Se, and an easy-to-move element such as Al. Such a compound is exemplified by AlTe, MgTe, or ZnTe. As for the composition of the compound containing Te as such, e.g., AlTe, the content of Al is preferably 20 atomic % or higher but 60 atomic % or lower. As an anionic component, a chalcogen element such as sulfur (S) or selenium (Se) may be contained together with Te. Note that the intermediate layer 43 made of AlTe has the band gap of 2.5 eV, and the resistance change layer 21 made of AlOx has the band gap of 8 eV to 9 eV, for example. The intermediate layer 43 in this embodiment is an electrolyte layer higher in resistance than the ion source layer 22. With this intermediate layer 43 provided between the ion source layer 22 and the resistance change layer 21, the erasing characteristics are to be improved through effective application of a voltage bias during erasing onto the interface (the resistance change layer 21) of the anode electrode (the lower electrode 10).

Even when the intermediate layer 43 is formed only by a chalcogen element, a chalcogen compound is consequently formed due to diffusion of an easy-to-move element of Al from the adjacent ion source layer 22. As such, the intermediate layer 43 does not necessarily contain the easy-to-move element of Al or others when it is formed. Herein, the ratio of the content of aluminum (density of aluminum) to the content of a chalcogen element in the intermediate layer 43 is preferably lower than 40%. This is because if the ratio is higher than the stoichiometric composition of $Al_2Te_3$, Al is deposited in the form of metal, and this adversely affects the adhesion strength in the memory layer 20. This is applicable to the intermediate layer containing MgTe, ZnTe, or others, and the content of Mg and Zn is preferably lower than Mg 50% and Zn 50% in the stoichiometric composition of MgTe and ZnTe.

When the memory layer 20 includes the intermediate layer 43 with a high content of a chalcogen element as in the embodiment, oxides of Ti or others may be formed in advance on the lower electrode 10. The easy-to-move element (especially Al, Mg, or Zn, for example) in the ion source layer 22 moves onto the lower electrode 10, and a high-resistance oxide film is formed on a relatively-low-resistance oxide film of TiOx or others. The oxide film of TiOx or others serve to prevent degradation of the lower electrode 10 by the repeated rewriting operation of the resistance change layer such as AlOx. Therefore, after the lower electrode 10 is formed, the process of forming the resistance change layer 21 may be skipped, and the intermediate layer 43 may be formed directly on the lower electrode 10.

The function and effect of the memory element 2 in this embodiment are similar to those of the memory element 1 in the first embodiment, but including the intermediate layer 43 allows to apply effectively the voltage bias during the erasing operation onto the lower electrode 10 (the resistance change layer 21). This accordingly enhances the efficiency of anodic reaction, facilitates dissolution of a filament, and leads to easy formation of a high-resistance oxide film by the easy-to-move element of Al, for example. To be more specific, achieved is the effect of improving the retention characteristics with the increased stability especially on the erasing side while the repeated durability remains satisfactory. Moreover, the erasing operation at a low current is enabled such that the operation is performed with good stability at a low current.

Described below are specific examples of the present disclosure. Various samples were manufactured as below with the structures of the memory elements 1 and 2 described above, and their characteristics were examined Experiment 1

(Samples 1-1 to 1-24)

First of all, on a silicon wafer formed with an oxide film on the surface, a TiN layer was formed with the thickness of 50 nm as the lower electrode 10. Thereafter, a multi-layer film corresponding to the memory layer 20 or 40 was formed, thereby manufacturing samples 1-1 to 1-24. The composition and the film thickness of each sample corresponding to "lower electrode/resistance change layer/(intermediate layer)/ion source layer" were "TiN/AlOx (2 nm)/[Ti (1 nm)/Al (1 nm)/Cu (0.2 nm)/Te (1 nm)/Zr (0.35 nm)]×15" (no intermediate layer is provided in this example) in Sample 1, for example. Next, similarly to the actual element processing, a heat treatment was performed at a temperature of 300° C., and then a diamond pen was used to make a cross-shaped scratch on the surface with the aim of reproducing the height difference by processing of the memory layer. The memory layers 20 and 40 were then assessed by an adhesion test, that is, placing an adhesion tape on the scratch, and then peeling off the tape. Table 1 shows the composition and the film thickness of layers corresponding to the resistance change layer 21, the intermediate layer 43, and the ion source layer 22 in each of Samples 1-1 to 1-24. Table 1 also shows the result of the adhesion test, and therein, "Good" indicates the result of no film peeling, and "No Good" indicates the result of film peeling.

TABLE 1

| | Resistance Change Layer (nm) | Intermediate Layer (nm) | Ion Source Layer (nm) | Film Peeling Test |
|---|---|---|---|---|
| Sample 1-1 | AlOx(2) | — | [Te(1)/Al(1)/Cu(0.2)/Te(1)/Zr(0.35)] × 15 | Good |
| Sample 1-2 | AlOx(2) | — | [Te(1)/Cu(0.2)/Te(1)/Zr(0.35)/Al(1)] × 15 | No Good |
| Sample 1-3 | AlOx(2) | — | [Te(1)/Zr(0.35)/Cu(0.2)/Al(1)] × 15 | No Good |
| Sample 1-4 | AlOx(2) | — | [Al(1)/Te(1)/Zr(0.35)/Cu(0.2)] × 15 | No Good |
| Sample 1-5 | AlOx(2) | — | [Zr(0.35)/Te(1)/Al(1)/Cu(0.2)/Te(1)] × 15 | Good |
| Sample 1-6 | AlOx(2) | — | [Al(1)/Cu(0.2)/Te(1)/Zr(0.35)/Te(1)] × 15 | Good |
| Sample 1-7 | AlOx(2) | — | [Te(1)/Zr(0.35)/Te(1)/Al(1)/Cu(0.2)] × 15 | No Good |
| Sample 1-8 | AlOx(2) | — | [Te(1)/Zr(0.35)/Te(1)/Al(1)/Cu(0.2)] × 15/Te(1) | Good |
| Sample 1-9 | AlOx(2) | — | [Te(1)/Al(1)/Cu(0.2)/GeTe(1)/Zr(0.35)] × 15 | Good |
| Sample 1-10 | AlOx(2) | — | [Te(1)/GeTe(1)/Al(1)/Cu(0.2)/Zr(0.35)] × 15 | No Good |
| Sample 1-11 | AlOx(2) | — | [Te(1)/Al(1)/Te(1)/CuZr(0.6)] × 15 | Good |
| Sample 1-12 | AlOx(2) | — | [Te(1)/CuZr(0.6)/Al(1)] × 15 | No Good |
| Sample 1-13 | GdOx(2) | — | [Te(1)/Al(1)/Cu(0.2)/Te(1)/Zr(0.35)] × 15 | Good |
| Sample 1-14 | GdOx(2) | — | [Te(1)/Cu(0.2)/Te(1)/Zr(0.35)/Al(1)] × 15 | No Good |
| Sample 1-15 | Natural Oxidation | Te(4) | [Te(1)/Al(1)/Cu(0.2)/Te(1)/Zr(0.35)] × 15 | Good |

TABLE 1-continued

| | Resistance Change Layer (nm) | Intermediate Layer (nm) | Ion Source Layer (nm) | Film Peeling Test |
|---|---|---|---|---|
| Sample 1-16 | Natural Oxidation | Te(4) | [Te(1)/Cu(0.2)/Te(1)/Zr(0.35)/Al(1)] × 15 | No Good |
| Sample 1-17 | AlOx(2) | — | [Te(1)/Al(1)/Cu(0.2)/Te(1)/Ti(0.35)] × 15 | Good |
| Sample 1-18 | AlOx(2) | — | [Te(1)/Cu(0.2)/Te(1)/Ti(0.35)/Al(1)] × 15 | No Good |
| Sample 1-19 | AlOx(2) | — | [Te(1)/Al(1)/Cu(0.2)/Te(1)/Hf(0.35)] × 15 | Good |
| Sample 1-20 | AlOx(2) | — | [Te(1)/Cu(0.2)/Te(1)/Hf(0.35)/Al(1)] × 15 | No Good |
| Sample 1-21 | AlOx(2) | — | [Te(1)/Al(1)/Cu(0.2)/Te(1)/Nb(0.35)] × 15 | Good |
| Sample 1-22 | AlOx(2) | — | [Te(1)/Cu(0.2)/Te(1)/Nb(0.35)/Al(1)] × 15 | No Good |
| Sample 1-23 | AlOx(2) | — | [Te(1)/Al(1)/Cu(0.2)/Te(1)/Mo(0.35)] × 15 | Good |
| Sample 1-24 | AlOx(2) | — | [Te(1)/Cu(0.2)/Te(1)/Mo(0.35)/Al(1)] × 15 | No Good |

Experiment 2

[Samples 2-1 to 2-6]

Next, as Samples 2-1 to 2-6, manufactured were memory devices of FIGS. 4 and 5 including the layers structured similarly to those of Samples 1-1 to 1-5. First of all, a MOS transistor Tr was formed on a semiconductor substrate 11. Next, an insulation layer was so formed as to cover the surface of the semiconductor substrate 11, and a via hole was formed in this insulation layer. Thereafter, by CVD (Chemical Vapor Deposition), the via hole was filled therein with an electrode material made of TiN, and the surface of the resulting via hole was made flat by CMP (Chemical Mechanical Polishing). Thereafter, by repeating such processes, a plug layer 15, a metallic wiring layer 16, a plug layer 17, and the lower electrode 10 were formed, and then the lower electrode 10 was subjected to patterning on the memory cell basis.

Next, the memory layer 20, and the upper electrode 30 was formed on the lower electrode 10 made of TiN using a device for sputtering. The diameter of the electrode was 50 to 300 nmφ. Thereafter, the upper electrode 30 was subjected to etching on the surface, thereby forming a wiring layer (Al layer) with the thickness of 200 nm for a connection to a contact portion where an external circuit was connected for provision of an intermediate potential (Vdd/2). Next, as a post-annealing process, in a furnace for a vacuum heat treatment, the resulting structure was subjected to a heat treatment for two hours at the temperature of 300° C. The resulting structure was then subjected to microprocessing so that a memory element was manufactured. Table 2 shows the result of observing the occurrence of film peeling during the microprocessing using an optical microscope. In Table 2, "Good" indicates the result that the writing and erasing was performed normally in 95% or more of the elements in an array of 4 kbit, and the film peeling was not observed therein. Also in Table 2, "No Good" indicates the result that 95% or less of bits were operating normally, and the end portion(s) of the array had the visual indication of film peeling.

TABLE 2

| | Electrode (nm) | Resistance Change Layer (nm) | Ion Source Layer (nm) | Electrode (nm) | Film Peeling Test |
|---|---|---|---|---|---|
| Sample 2-1 | W | AlOx(2) | [Te(1)/Al(1)/Cu(0.2)/Te(1)/Zr(0.35)] × 15 | W(50) | Good |
| Sample 2-2 | W | AlOx(2) | [Te(1)/Cu(0.2)/Te(1)/Zr(0.35)/Al(1)] × 15 | W(50) | No Good |
| Sample 2-3 | W | AlOx(2) | [Te(1)/Zr(0.35)/Cu(0.2)/Al(1)] × 15 | W(50) | No Good |
| Sample 2-4 | W | AlOx(2) | [Al(1)/Te(1)/Zr(0.35)/Cu(0.2)] × 15 | W(50) | No Good |
| Sample 2-5 | W | AlOx(2) | [Zr(0.35)/Te(1)/Al(1)/Cu(0.2)/Te(1)] × 15 | W(50) | Good |
| Sample 2-6 | W | AlOx(2) | [Al(1)/Cu(0.2)/Te(1)/Zr(0.35)/Te(1)] × 15 | W(50) | Good |

Figure 7A:
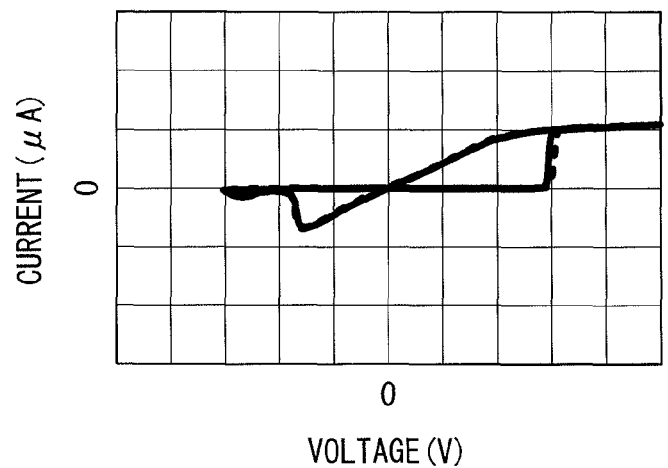
FIGS. 7A and 7B are each a diagram showing the current-voltage characteristics according to Example 1 and Comparison Example 1.
Figure 7B:
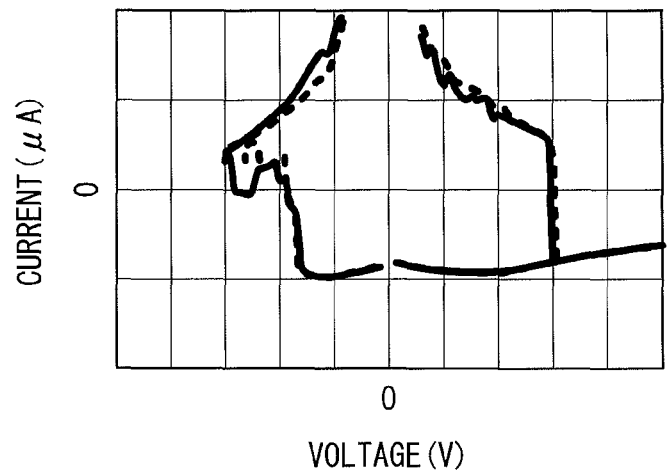
Figure 8:
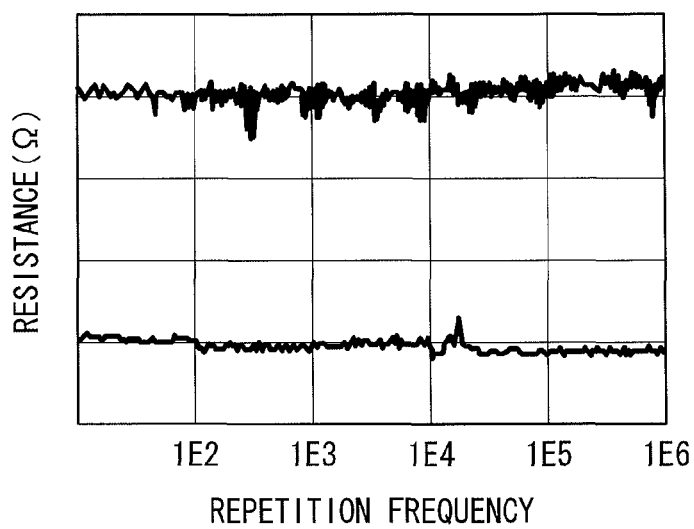
FIG. 8 is a diagram showing the data retention characteristics according to Example 2.
Figure 9A:
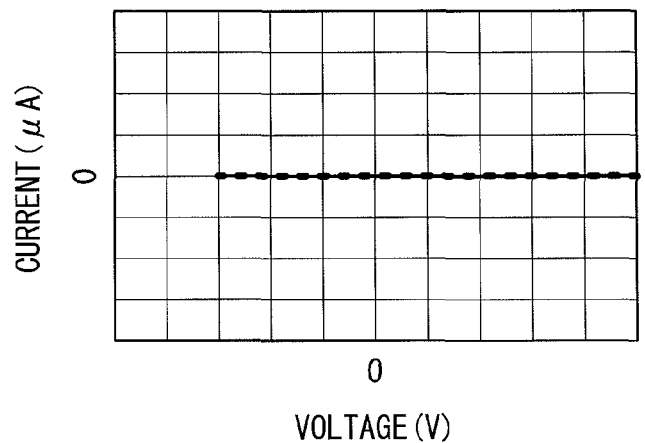
FIGS. 9A and 9B are each a diagram showing the current-voltage characteristics according to Example 2.
Figure 9B:
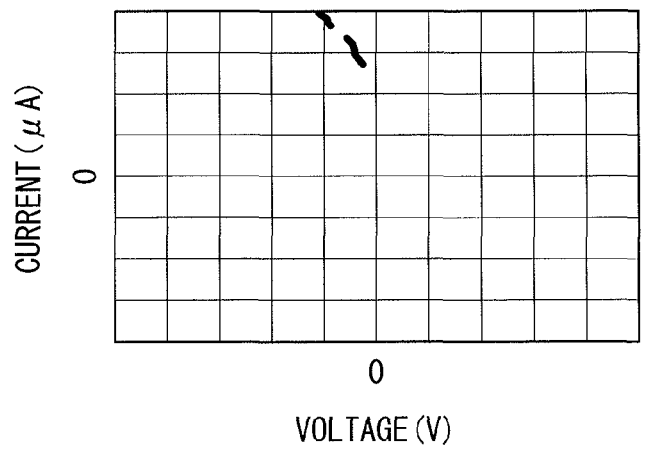

FIGS. 7A and 7B show the current-voltage characteristics in Sample 2-1. In Sample 2-1, the initial state is high in resistance with about 10 MΩ, and the state is changed to be low in resistance by a negative bias on the lower electrode 10 side. With a positive bias on the lower electrode 10 side, the state becomes high in resistance again. This shows that the memory element including the memory layer 20 with the composition as in Sample 2-1 performed the memory operation satisfactorily. FIG. 8 shows the repeated operation characteristics in Sample 2-1. Assuming that the low-resistance side was in the state of writing, and the high-resistance side was in the state of erasing, the rewriting operation was repeatedly performed for million times. In the rewriting operation, for recording pulses, the recording voltage (Vw) was 3 V, the recording current was about 100 μA, and the pulse duration was 10 ns, and for erasing pulses, the erasing voltage (Ve) was 2 V, an erasing current was about 110 μA, and the pulse duration was 10 ns. As is known from FIG. 8, in Sample 2-1, the repeated operation characteristics were satisfactory. FIGS. 9A and 9B each show the current-voltage characteristics in Sample 2-5 with which film peeling was observed. With the memory element observed with film peeling, the memory operation results in a failure.

[Assessment]

In comparison with the results of Tables 1 and 2, the film-peeling test using the adhesive tape and that by the microprocessing show the same results, and therefore, the result of Table 1 seems available for assessment of the adhesion of the memory layers 20 and 40 by the microprocessing.

In the ion source layer 20 in Samples 1-1 to 1-4, the order of layer stacking (Layers A, B, and C) at the time of film formation is as below.

Sample 1-1: ABBAC/ . . . /ABBAC
Sample 1-2: ABABC/ . . . /ABABC
Sample 1-3: ACBB/ . . . /ACBB
Sample 1-4: BACB/ . . . /BACB Similarly to Sample 2-1, Sample 1-1 shows no film peeling. This seems, at the time of manufacturing, due to the structure of using layers (the layers A described above) containing a chalcogen element (Te in this example) to sandwich therebetween a layer (the layer B described above) containing any of the elements configuring the ion source layer 22 being an electrolyte layer. To be specific, the layer B contains any of the elements that easily reacts with the chalcogen elements, and is easy to move in the electrolyte, that is, is highly movable (Al and Cu in this example). On the other hand, in Samples 1-2 to 1-4 (and Samples 2-2 to 2-4), film peeling was observed. This seems due to the structure in which the layer B is not sandwiched between the layers A, and the layers A are in contact with a layer (the layer C described above) containing an element that is difficult to move in the ion source layer 22, that is, an element that does not easily react with the chalcogen elements, and is not that movable.

In the ion source layer 20 in Samples 1-5 to 1-7, the order of layer stacking is as below with the same representation as above.

Sample 1-5: C(ABBA/C)ABBA/ . . . /CABBA
Sample 1-6: BBAC(A/BBA)CA/ . . . /BBACA
Sample 1-7: AC(ABB/A)CABB/ . . . /ACABB Samples 1-5 to 1-7 include the repeated structure in round brackets similar to that in Sample 1-1. However, Samples 1-5 and 1-6 show no film peeling but Sample 1-7 shows film peeling. Sample 1-8 has the same repeated stacking structure as Sample 1-7, but includes another layer A at the top end thereof, thereby reducing the possibility of film peeling. Such a difference lies in their top end surfaces of the ion source layer 22, in other words, the different top end surfaces of their repeated stacking structure. This means that, in order to reduce the possibility of film peeling, the top end of the repeated stacking structure is not the layer B containing a highly-movable element, but is preferably the layer A containing a chalcogen element or the layer C containing a not-so-movable element, and the upper electrode 30 is formed thereon.

Moreover, Samples 1-9 and 1-10 are each a chalcogen layer with an addition of Ge, and Samples 1-21 and 1-22 are each a fixed layer with an addition of Cu. The result in Table 1 shows that the layers, i.e., the chalcogen layer (layer A), the movable layer (layer B), and the fixed layer (layer C), may contain any other elements as long as that does not impair the effect of the present technology.

In the ion source layer 20 in Samples 1-9, 1-10, 1-11, and 1-12, the order of layer stacking is as below with the same representation as above.

Sample 1-9: ABBAC/ . . . /ABBAC
Sample 1-10: AABBC/ . . . /AABBC
Sample 1-11: ABAC/ . . . /ABAC
Sample 1-12: ACB/ . . . /ACB This shows that the ion source layer 22 has the multi-layer structure in which the layer B is sandwiched between the layers A not on the bottom, and the top end surface of the ion source layer 20 is not the layer B. This structure accordingly reduces the possibility of film peeling.

Moreover, Samples 1-13 and 1-14 show that the resistance change layer 21 is not restricted to be AlOx but may also be GdOx. As such, the possibility of film peeling is reduced by structuring the memory elements 1 and 2 as described in the embodiments above with no restriction about the material of the resistance change layer. Also with Samples 1-15 and 1-16 in which the intermediate layer 43 made of Te is provided between the resistance change layer 21 and the ion source layer 22, the possibility of film peeling is reduced by structuring the ion source layer 22 as described in the embodiments above. Alternatively, the resistance change layer 21 may be formed by oxidizing the lower electrode 10 formed thereon with an Al layer. Alternatively, when the lower electrode 10 made of TiN is naturally oxidized to form TiOx serving as an electrode-deterioration protection layer and then the intermediate layer 43 is provided thereto, the easy-to-move element such as Al in the ion source layer 22 diffuses onto the lower electrode 10 via the intermediate layer 43 so that an oxide film of AlOx or others are self-formed. Even in such a case, using the ion source layer 22 in the repeated stacking structure according to the embodiments of the present disclosure leads to the reduced possibility of film detaching and peeling between the layers.

Moreover, Samples 1-17 to 1-24 show that, other than Zr, the not-so-movable element configuring the fixed layer (layer C) may also be Ti (1-17 and 1-18), Hf (1-19 and 1-20), Nb (1-21 and 1-22), Mo (1-23 and 1-24) or others also reduce the possibility of film peeling with the structures described in the embodiments above. Accordingly, for the use in the fixed layer, that is, in the second layer, any element whose reactivity against the chalcogen elements is similar to Zr, in other words, any element of Groups 4 to 6 in the periodic table (long-periodic table) seems to produce the effect similar to that achieved in the embodiments of the present technology.

While the present disclosure has been described in detail by referring to the first and second embodiments and Examples, the present disclosure is not restrictive to the embodiments and others described above, and numerous other modifications may be possibly devised.

For example, in the embodiments and others described above, the configurations of the memory elements 1 and 2, and that of the memory cell array are specifically described. However, all of the layers are not necessarily provided, or any other layers may be also provided.

Further, for example, the materials of the layers, the film-forming methods and condition, and others described in the embodiments and others above are surely not restrictive, and any other materials, or any other film-forming methods will also do. For example, the ion source layer 22 may be added with any other types of transition metallic element such as Ti, Hf, V, Nb, Ta, Cr, Mo, or W as long as the composition ratio described above remains the same, and Cu, Ag, and zinc (Zn) are surely not restrictive, and nickel (Ni) may be added.

Still further, exemplified in the embodiments described above is, in the manufacturing processes of the ion source layer 22 in the repeated stacking structure in which the first and second layers 22A and 22B are alternately stacked one on the other, to form films in the repeated stacking structure including the layers A and B being the first layer 22A, and the layer C being the second layer. The order of layer stacking is not necessarily expected to remain the same. To be specific, the order of layer stacking is not restricted as long as the layers B and C are not directly in contact with each other, and the layer B is not at the top end of the resulting structure.

The present technology is also possibly in the following structures.

(1) A memory element, including:
a first electrode, a memory layer, and a second electrode in this order, wherein the memory layer includes
a resistance change layer containing an oxide, and the resistance change layer being provided on the first electrode side, and
an ion source layer in a stacking structure of two or more of a unit ion source layer, the unit ion source layer including a first layer and a second layer, the first layer containing one or more of chalcogen elements of tellurium (Te), sulfur (S), and selenium (Se) and an easy-to-move element that is easy to move in the memory layer, and having a density distribution of the easy-to-move element from the first electrode to the second electrode, and the second layer containing a difficult-to-move element that is difficult to move in the memory layer.

(2) The memory element according to (1), wherein the unit ion source layer includes the first layer and the second layer in this order from the first electrode side.

(3) The memory element according to (1), wherein the unit ion source layer includes the second layer and the first layer in this order from the first electrode side.

(4) The memory element according to any one of (1) to (3), wherein
in the easy-to-move element in the first layer, a density on a bonded interface with the second layer is relatively lower than that in a remaining region of the first layer.

(5) The memory element according to any one of (1) to (4), wherein
the easy-to-move element is a metallic element that is possibly cationized.

(6) The memory element according to any one of (1) to (5), wherein
the easy-to-move element is aluminum (Al) or copper (Cu).

(7) The memory element according to any one of (1) to (6), wherein
the difficult-to-move element is a metallic element of Groups 4 to 6 in a periodic table.

(8) The memory element according to any one of (1) to (7), wherein
the difficult-to-move element is titanium (Ti), zirconium (Zr), hafnium (Hf), vanadium (V), niobium (Nb), tantalum (Ta), chromium (Cr), molybdenum (Mo), or tungsten (W).

(9) The memory element according to any one of (1) to (8), wherein
a change of resistance value occurs by formation of a low-resistance section including a metallic element in the resistance change layer in response to application of a voltage to the first electrode and the second electrode.

(10) The memory element according to any one of (1) to (9), wherein
the memory layer includes an intermediate layer between the ion source layer and the resistance change layer, and the intermediate layer contains one or more of the chalcogen elements of tellurium (Te), sulfur (S), and selenium (Se).

(11) A memory device, including:
a plurality of memory elements each including a first electrode, a memory layer, and a second electrode in this order; and
a pulse application section applying a voltage or current pulse selectively to the memory elements, wherein
the memory layer includes
a resistance change layer containing an oxide, and the resistance change layer being provided on the first electrode side, and
an ion source layer in a stacking structure of two or more of a unit ion source layer, the unit ion source layer including a first layer and a second layer, the first layer containing one or more of chalcogen elements of tellurium (Te), sulfur (S), and selenium (Se) and an easy-to-move element that is easy to move in the memory layer, and having a density distribution of the easy-to-move element from the first electrode to the second electrode, and the second layer containing a difficult-to-move element that is difficult to move in the memory layer.

(12) A method of manufacturing a memory element, the method including:
forming a first electrode on a substrate;
forming a resistance change layer containing an oxide on the first electrode;
forming one or more chalcogen layers containing one or more of chalcogen elements of tellurium (Te), sulfur (S), and selenium (Se), one or more movable layers containing one or more of easy-to-move elements that are easy to move in an electrolyte, one or more fixed layers containing one or more of difficult-to-move elements that are difficult to move in the electrolyte, and an ion source layer including two or more unit ion source layers in which partially or more is in the stacking structure of the chalcogen layer, the movable layer, and the fixed layer in this order; and
forming a second electrode on the ion source layer.

(13) The method according to (12), wherein
a mixture layer of the chalcogen layer and a movable layer is formed by diffusion of the easy-to-move element after formation of the second electrode.

(14) The method according to (12) or (13), wherein
after formation of the resistance change layer, an intermediate layer containing one or more of the chalcogen elements of tellurium (Te), sulfur (S), and selenium (Se) is formed.

(15) The method according to any one of (12) to (14), wherein
when a top end of the ion source layer is the movable layer, the chalcogen layer is additionally formed thereon.

(16) The method according to any one of (12) to (15), wherein
among the chalcogen layer, the movable layer, and the fixed layer, two or more layers of at least the chalcogen layer are included, and partially or more includes a stacking of the chalcogen layer, the movable layer, and the chalcogen layer in this order.

The present disclosure contains subject matter related to that disclosed in Japanese Priority Patent Application JP 2011-146114 filed in the Japan Patent Office on Jun. 30, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
a first electrode, a memory layer, and a second electrode in this order, wherein,
the memory layer includes
(a) a resistance change layer containing an oxide, and
(b) an ion source layer comprising a stacking structure of two or more unit ion source layers, each unit ion source layer including a first layer and a second layer, the first layer containing (i) chalcogen elements of tellurium (Te), sulfur (S), or selenium (Se) or any combination of them and (ii) an easy-to-move element that is easy to move in the memory layer, the first layer having a non-uniform distribution of the easy-to-move element from the first electrode to the second electrode, the second layer containing a difficult-to-move element that is difficult to move in the memory layer, the easy-to-move element being able to diffuse more easily into the memory layer than the difficult-to-move element.

2. The memory element according to claim 1, wherein the unit ion source layer includes the first layer and the second layer in this order from the first electrode side.

3. The memory element according to claim 1, wherein the unit ion source layer includes the second layer and the first layer in this order from the first electrode side.

4. The memory element according to claim 1, wherein an amount of the easy-to-move element in a surface region of the first layer that interfaces with the second layer is relatively lower than that in a remaining region of the first layer.

5. The memory element according to claim 1, wherein the easy-to-move element is a metallic element that is able to be cationized.

6. The memory element according to claim 1, wherein the easy-to-move element is aluminum (Al) or copper (Cu).

7. The memory element according to claim 1, wherein the difficult-to-move element is a metallic element in Group 4, Group 5, or Group 6 of a periodic table.

8. The memory element according to claim 1, wherein the difficult-to-move element is titanium (Ti), zirconium (Zr), hafnium (Hf), vanadium (V), niobium (Nb), tantalum (Ta), chromium (Cr), molybdenum (Mo), or tungsten (W).

9. The memory element according to claim 1, wherein a change of resistance value occurs by formation of a low-resistance section including a metallic element in the resistance change layer in response to application of a voltage to the first electrode and the second electrode.

10. The memory element according to claim 1, wherein the memory layer includes an intermediate layer between the ion source layer and the resistance change layer, and the intermediate layer contains one or more of the chalcogen elements of tellurium (Te), sulfur (S), and selenium (Se).

11. A memory device, comprising:
a plurality of memory elements. each memory element including a first electrode, a memory layer, and a second electrode in this order; and
a pulse application section applying a voltage or current pulse selectively to the memory elements,
wherein,
the memory layer of each memory element includes
(a) a resistance change layer containing an oxide, and
(b) an ion source layer comprising a stacking structure of two or more unit ion source layers, each unit ion source layer including a first layer and a second layer, the first layer containing (i) chalcogen elements of tellurium (Te), sulfur (S), or selenium (Se) or any combination of them and (ii) an easy-to-move element that is easy to move in the memory layer, the first layer having a non-uniform distribution of the easy-to-move element from the first electrode to the second electrode, the second layer containing a difficult-to-move element that is difficult to move in the memory layer, the easy-to-move element being able to diffuse more easily into the memory layer than the difficult-to-move element.

12. The memory device of claim 11, wherein the easy-to-move element is aluminum (Al) or copper (Cu).

13. The memory device of claim 11, wherein the difficult-to-move element is titanium (Ti), zirconium (Zr), hafnium (Hf), vanadium (V), niobium (Nb), tantalum (Ta), chromium (Cr), molybdenum (Mo), or tungsten (W).

14. The memory device of claim 11, wherein the distribution of the easy-to-move element in the first layer is such that an amount of the easier-to-move element in the middle portion of the first layer is greater than that of a surface portion of the first layer.

\* \* \* \* \*